United States Patent
Yao et al.

(10) Patent No.: US 9,245,952 B2
(45) Date of Patent: Jan. 26, 2016

(54) METHOD OF FORMING A SEMICONDUCTOR DEVICE AND STRUCTURE THEREFOR

(71) Applicant: Semiconductor Components Industries, LLC, Phoenix, AZ (US)

(72) Inventors: Thierry Coffi Herve Yao, Portland, OR (US); Moshe Agam, Portland, OR (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 14/275,176

(22) Filed: May 12, 2014

(65) Prior Publication Data

US 2015/0325651 A1    Nov. 12, 2015

(51) Int. Cl.
*H01L 29/10* (2006.01)
*H01L 29/78* (2006.01)
*H01L 29/66* (2006.01)

(52) U.S. Cl.
CPC ...... *H01L 29/1095* (2013.01); *H01L 29/66681* (2013.01); *H01L 29/7816* (2013.01); *H01L 29/7835* (2013.01)

(58) Field of Classification Search
CPC ............ H01L 29/0696; H01L 29/7835; H01L 29/0619; H01L 29/0634; H01L 29/0878; H01L 29/407; H01L 29/1095; H01L 29/7816; H01L 29/66681
See application file for complete search history.

(56) References Cited

U.S. PATENT DOCUMENTS

| | | | |
|---|---|---|---|
| 7,582,533 B2 | 9/2009 | Ko | |
| 2003/0173624 A1 | 9/2003 | Choi et al. | |
| 2007/0069308 A1* | 3/2007 | Ko | 257/401 |
| 2009/0321824 A1* | 12/2009 | Shima | 257/336 |
| 2012/0175673 A1* | 7/2012 | Lee | 257/140 |
| 2014/0110814 A1* | 4/2014 | Lin et al. | 257/492 |
| 2015/0123236 A1* | 5/2015 | Lin et al. | 257/487 |

* cited by examiner

*Primary Examiner* — Yasser A Abdelaziez
*Assistant Examiner* — Farun Lu
(74) *Attorney, Agent, or Firm* — Robert F. Hightower

(57) ABSTRACT

In one embodiment, a method of forming a semiconductor device may include forming a buried region within a semiconductor region, including forming an opening in the buried region. The method may also include forming a drift region of a second conductivity type in the semiconductor region with at least a portion of the drift region overlying a first portion of the buried region. Another portion of the method may include forming a first drain region of the second conductivity type in the drift region wherein the first drain region does not overlie the buried region.

14 Claims, 6 Drawing Sheets

METHOD OF FORMING A SEMICONDUCTOR DEVICE AND STRUCTURE THEREFOR

BACKGROUND OF THE INVENTION

The present invention relates, in general, to electronics, and more particularly, to semiconductors, structures thereof, and methods of forming semiconductor devices.

In the past, the semiconductor industry utilized various methods and structures to form metal oxide semiconductor (MOS) transistors and other devices. The breakdown voltage of the device often was an important characteristic of the semiconductor devices and various techniques were utilized to provide improved breakdown voltages. One structure that assisted in breakdown voltages was referred to as a reduced surface electric field (RESURF) layer. One problem was that these devices often required multiple doped regions or implant regions surrounding the RESURF layer. Another problem was that the doping concentrations of various regions generally had to be changed in order to provide a different breakdown voltage. However, changing the doping concentrations also affected other parameters of the devices.

Accordingly, it is desirable to have a method and structure that improves the breakdown voltage, that assist in changing the breakdown voltage without changing the doping concentration, that reduces the number of doping operations required to form the device, that facilitates forming multiple-devices of different breakdown voltage on one substrate, and/or that reduces the cost of the device.

Figure 1:
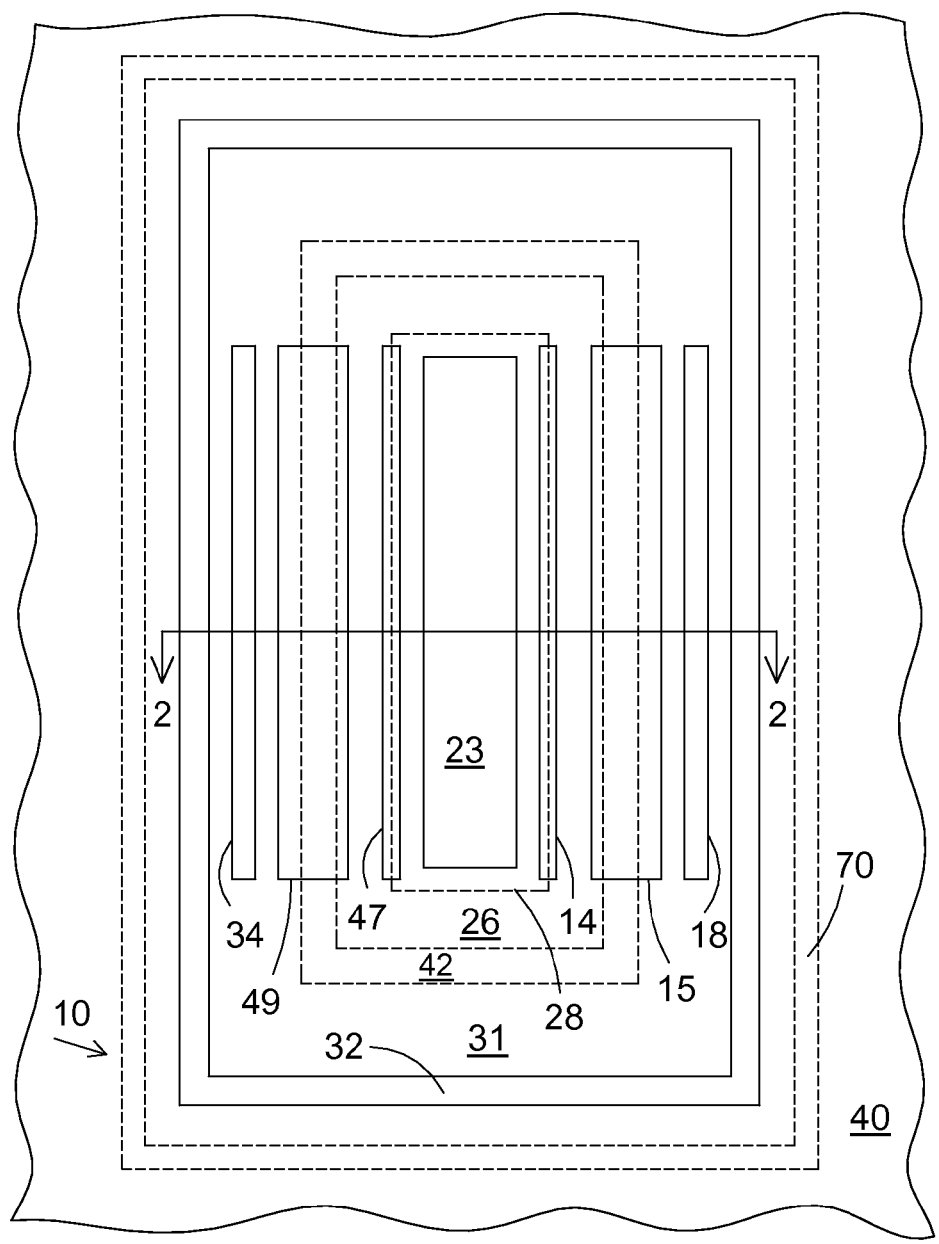
FIG. 1 illustrates an enlarged plan view of a portion of an example of an embodiment of a semiconductor device that is formed to have an improved breakdown voltage in accordance with the present invention.

For simplicity and clarity of the illustration(s), elements in the figures are not necessarily to scale, some of the elements may be exaggerated for illustrative purposes, and the same reference numbers in different figures denote the same elements, unless stated otherwise. Additionally, descriptions and details of well-known steps and elements may be omitted for simplicity of the description. As used herein current carrying element or current carrying electrode means an element of a device that carries current through the device such as a source or a drain of an MOS transistor or an emitter or a collector of a bipolar transistor or a cathode or anode of a diode, and a control element or control electrode means an element of the device that controls current through the device such as a gate of an MOS transistor or a base of a bipolar transistor. Additionally, one current carrying element may carry current in one direction through a device, such as carry current entering the device, and a second current carrying element may carry current in an opposite direction through the device, such as carry current leaving the device. Although the devices may be explained herein as certain N-channel or P-channel devices, or certain N-type or P-type doped regions, a person of ordinary skill in the art will appreciate that complementary devices are also possible in accordance with the present invention. One of ordinary skill in the art understands that the conductivity type refers to the mechanism through which conduction occurs such as through conduction of holes or electrons, therefore, that conductivity type does not refer to the doping concentration but the doping type, such as P-type or N-type. It will be appreciated by those skilled in the art that the words during, while, and when as used herein relating to circuit operation are not exact terms that mean an action takes place instantly upon an initiating action but that there may be some small but reasonable delay(s), such as various propagation delays, between the reaction that is initiated by the initial action. Additionally, the term while means that a certain action occurs at least within some portion of a duration of the initiating action. The use of the word approximately or substantially means that a value of an element has a parameter that is expected to be close to a stated value or position. However, as is well known in the art there are always minor variances that prevent the values or positions from being exactly as stated. It is well established in the art that variances of up to at least ten percent (10%) (and up to twenty percent (20%) for semiconductor doping concentrations) are reasonable variances from the ideal goal of exactly as described. When used in reference to a state of a signal, the term "asserted" means an active state of the signal and the term "negated" means an inactive state of the signal. The actual voltage value or logic state (such as a "1" or a "0") of the signal depends on whether positive or negative logic is used. Thus, asserted can be either a high voltage or a high logic or a low voltage or low logic depending on whether positive or negative logic is used and negated may be either a low voltage or low state or a high voltage or high logic depending on whether positive or negative logic is used. Herein, a positive logic convention is used, but those skilled in the art understand that a negative logic convention could also be used. The terms first, second, third and the like in the claims or/and in the Detailed Description of the Drawings, as used in a portion of a name of an element are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein. Reference to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but in some cases it may. Furthermore, the particular features, structures or characteristics may be combined in any suitable manner, as would be apparent to one of ordinary skill in the art, in one or more embodiments. For clarity of the drawings, doped regions of device structures are illustrated as having generally straight line edges and precise angular corners. However, those skilled in the art understand that due to the diffusion and activation of dopants the edges of doped regions generally may not be straight lines and the corners may not be precise angles.

In addition, the description illustrates a cellular design (where the body regions are a plurality of cellular regions) instead of a single body design (where the body region is comprised of a single region formed in an elongated pattern, typically in a serpentine pattern). However, it is intended that the description is applicable to both a cellular implementation and a single base implementation.

DETAILED DESCRIPTION OF THE DRAWINGS

FIG. 1 illustrates an enlarged plan view of a portion of an example of an embodiment of a semiconductor device 10 that is formed to have an improved breakdown voltage. An embodiment may also include that device 10 has an improved reduced surface field (RESURF) region that may assist in providing an improved breakdown voltage for device 10. In an embodiment, device 10 may have an improved electrostatic discharge performance. Another embodiment may include that device 10 has an improved drain structure. An embodiment of device 10 may be formed on a semiconductor substrate 40. In an embodiment, device 10 may be formed as an MOS transistor, for example as an LDMOS transistor, but may be formed as other types of semiconductor devices in other embodiments.

As will be seen further hereinafter, an embodiment may include forming the drain structure, the gate structure, and the source structure of device 10 as fingers that extend a length in a longitudinal direction along a long axis of the structures. Consequently, for such an embodiment there may be more than one source element and more than one gate element in the respective source and gate structures as will be seen further hereinafter.

Figure 2:
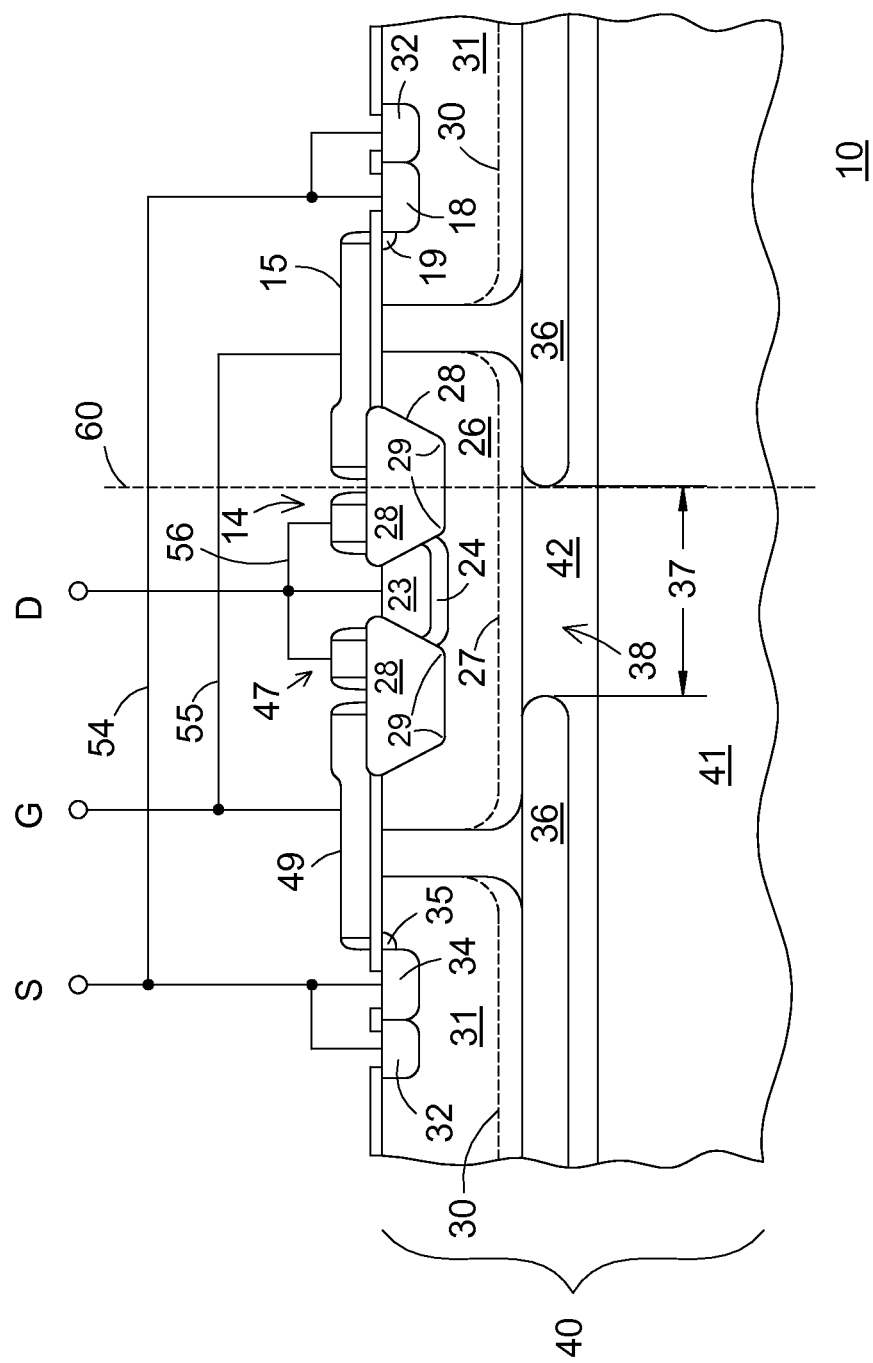
FIG. 2 illustrates an enlarged cross-sectional portion of the device of FIG. 1 in accordance with the present invention.

FIG. 2 illustrates an enlarged cross-sectional portion of device 10 along cross-section line 2-2 that is illustrated in FIG. 1. This description has references to FIG. 1 and FIG. 2. Device 10 is formed on a bulk semiconductor substrate 41. A semiconductor region 42 typically is formed overlying substrate 41. In some embodiments, substrate 40 may include substrate 41 and region 42. In an embodiment, region 42 may be formed on a surface of substrate 41. A buried region 36 is formed within semiconductor region 42. In one embodiment, region 36 does not extend to the surface of region 42. Region 36 typically does not extend to touch or contact the surface of substrate 41. However, in some embodiments region 36 may physically and electrically contact substrate 41. In most embodiments, region 36 does not extend into substrate 41.

Device 10 may include a drift region 26 that is formed within semiconductor region 42 and overlying a portion of a buried region 36. Drift region 26 assists in transporting carriers through device 10. In one embodiment, drift region 26 typically extends from the surface of region 42 a distance into region 42 that is sufficient to physically and electrically contact a portion of region 36. An embodiment may also include that region 26 does not touch region 36 as illustrated by a dashed line 27. A drain structure may be formed within drift region 26. A vertical drain region 24 of the drain structure may be formed within region 26 and a drain region 23 of the drain structure may be formed within vertical drain region 24. Device 10 may also include a body region 31 that may be formed within semiconductor region 42 and spaced laterally apart from drift region 26. An embodiment may include that region 31 may contact region 26. Region 31 is also formed to at least overlie a portion of region 36. An embodiment may include forming body region 31 to extend from the surface of region 42 a distance sufficient to physically and electrically contact a portion of region 36. In some embodiments, region 36 is electrically connected to region 31. In another embodiment, region 31 may not physically contact region 36 as illustrated by a dashed line 30. Buried region 36 may be formed to underlie at least a portion of regions 31 and 26. A source region 34 may be formed within body region 31. An embodiment may include forming gate structures or gates 15 and 49 overlying a portion of regions 26 and 31 and overlying a portion of region 42 that is between regions 26 and 31. In an embodiment, gates 15 and 49 may be formed overlying a portion of the surface of region 42. Gates 15 and 49 may have other structural configurations in other embodiments, for example, the gates may be formed to extend vertically into a portion of region 42 such as being formed as a trench type of gate. A body contact region or body contact 32 may be formed within region 31 to facilitate forming a low resistance electrical connection to region 31. In one embodiment, region 32 may be electrically connected to sources 18 and 34, but may not be electrically connected thereto in other embodiments. An embodiment may include forming region 32 adjacent to and abutting sources 18 and 34. In other embodiments, region 32 may not abut sources 18 and 34. Some embodiments may include forming optional lateral drain regions (LDD) 19 and 35 adjacent to, and in some embodiments abutting, respective sources 18 and 34. Lateral drain regions 19 and 35 may be utilized to assist in forming a channel region in portions of region 31 that underlie insulators or spacers 17 (see FIG. 5) of gates 15 and 49. A field insulator 28 typically is formed surrounding drain region 23 and vertical drain region 24. An embodiment may include forming field plate structures 14 and 47 that include field plate conductors on insulator 28 and electrically connected to region 23.

Referring back to FIG. 1, one embodiment of device 10 may include forming the drain structure that includes drain region 23 in a rectangular or elongated shape and forming field insulator 28 surrounding the drain structure. Field plate structures 14 and 47 may be formed as strips along the sides of the drain structure. In another embodiment, structures 14 and 47 may be electrically connected together at one end of the drain structure or alternately may surround the drain structure similar to insulator 28. Gates 15 and 49 may also be formed as strips extending along the sides of the drain structure and spaced laterally away from structures 14 and 47. In another embodiment, gates 15 and 49 may extend longitudinally in one direction around one and of the drain structure in order to form an electrical and physical connection between gates 15 and 49. In another alternate embodiment, gates 15 and 49 may be formed as one continuous structure surrounding the drain structure. Similarly, an embodiment may include forming sources 18 and 34 as strips along opposite sides of the drain structure. In some embodiments, sources 18 and 34 may be spaced laterally apart from gates 15 and 49. In an alternate embodiment, sources 18 and 34 may extend longitudinally and traverse laterally to be physically and electrically connected together, and another alternate embodiment may include that sources 18 and 34 may be portions of one continuous gate structure surrounding gates 15 and 49.

Those skilled in the art will appreciate that the structural elements of device 10 may be formed with other geometrical shapes instead of the finger shapes that are illustrated in FIG. 1. For example, an alternate embodiment may have a single source instead of the multiple stripes or fingers illustrated in FIG. 1. For example, an embodiment of device 10 may include only portions of device 10 illustrated on the left side of a dashed lines 60 (FIG. 2).

Figure 3:
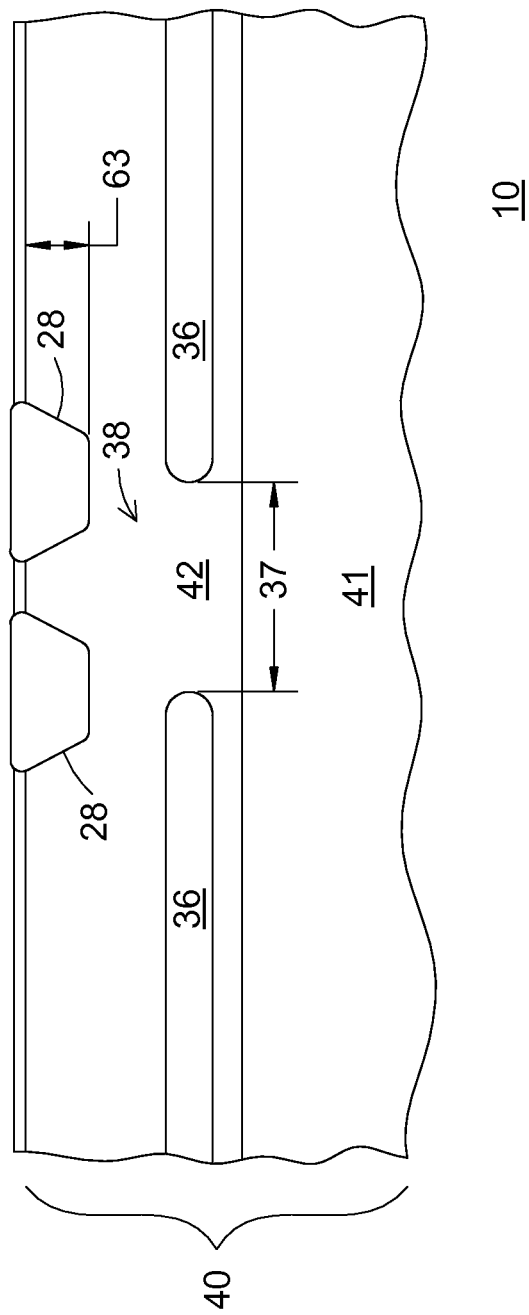
FIG. 3-FIG. 5 illustrates various stage of an example of an embodiment of a method of forming the device of FIG. 1 and FIG. 2 in accordance with the present invention.

FIG. 3 illustrates device 10 at an early stage of an example of an embodiment of a method of forming device 10. Semiconductor region 42 is formed on a surface of substrate 41. In one embodiment, region 42 may be formed as an epitaxial layer on the surface of substrate 41. In another embodiment, region 42 may be formed as a doped region within substrate 41. One embodiment may include forming region 42 as an epitaxial layer with a variable doping concentration such as a doping concentration that varies of different distances from the surface of region 42. For example the doping profile may have a peak concentration near the middle of region 42 and may decrease in either direction away from the peak, such as decrease toward substrate 41 and decrease toward the surface of region 42. Another embodiment may include forming region 42 as a plurality of epitaxial layers. An embodiment may include forming substrate 41 and region 42 to have the same conductivity type. The doping concentration of substrate 41 typically is greater than the doping concentration of region 42. An embodiment may include that region 42 is formed with a doping concentration of approximately 1E14-1E17 atoms/cm$^3$. In one example embodiment, such as for a breakdown voltage of approximately one hundred volts (100V), region 42 may typically gave a doping concentration of approximately 1E15 atoms/cm$^3$. Subsequently, insulator 28 may be formed on the surface of region 42 and extending a distance 63 into region 42. Insulator 28 may be formed from silicon dioxide or other known insulating materials. In some embodiments, insulator 28 may be referred to as a field oxide or field insulator. In some embodiments insulator 28 may be formed by well-known methods or techniques including formed as a shallow trench isolation structure or formed by local oxidation of silicon (LOCOS), or other known techniques. During the formation of insulator 28, a portion of the surface of region 42 may be oxidized as illustrated by a thin layer on the surface of region 42. The oxidized portion may or may not be removed.

Subsequently, buried region 36 may be formed within region 42 with an opening 38 within region 36 that at least underlies where drain region 23 is going to be formed. In an embodiment, region 36 may be formed with a conductivity type that is the same as the conductivity type of region 42. Those skilled in the art will appreciate that region 36 may also be formed as two separate regions that are spaced apart by a distance 37 to form opening 38, thus, the two separate portions of region 36 may not be physically connected together, but are usually electrically connected together. For example, the two separate portions of region 36 may be electrically connected together by electrically connecting both to region 31 (FIG. 2), such as for example physically and electrically contacting region 31, or by a separate electrical connection.

Figure 4:
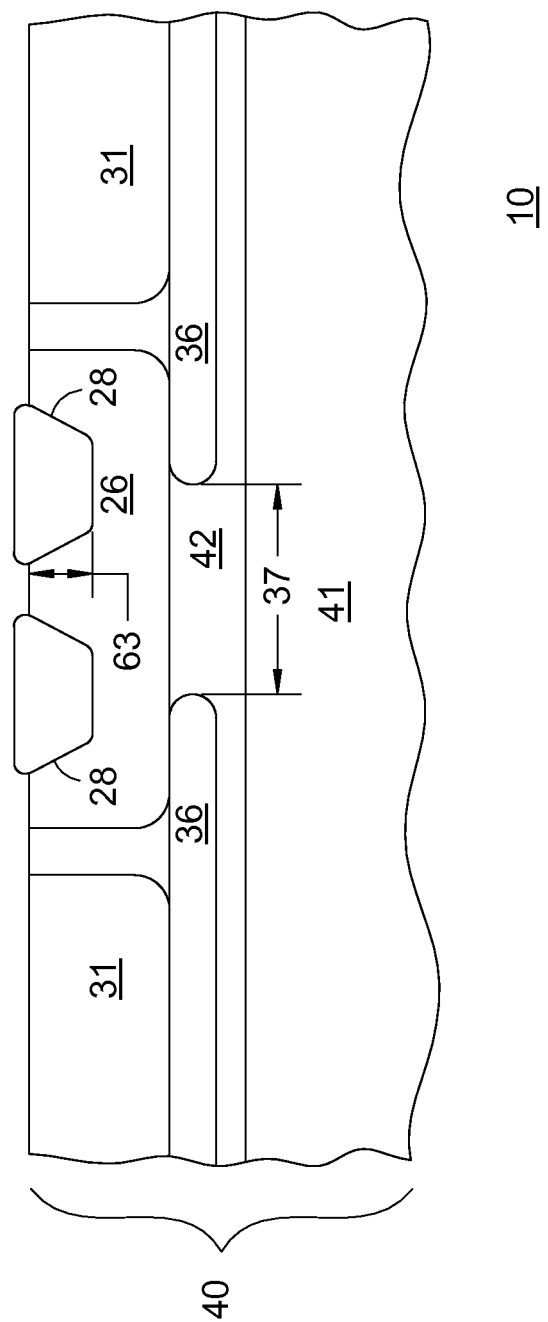

FIG. 4 illustrates device 10 at a subsequent stage in the example embodiment of the method of forming device 10. Drift region 26 typically is formed extending from the surface of region 42 a distance into region 42. In an embodiment, the distance is sufficient to form region 26 contacting a portion of region 36. A mask may be applied and patterned to expose the portion of region 42 where region 26 is to be formed and dopants may be implanted and annealed to form region 26. Region 26 has a conductivity type that is opposite to the conductivity type of region 42. In an embodiment, the doping concentrations of region 42 and buried region 36 are selected to provide a charge in region 36 that is substantially balanced by the charge of region 26. An embodiment of device 10 may include forming the doping concentration of region 26 to be substantially equal to the doping concentration of buried region 36. This assists in increasing the depletion of region 26 during high voltage situations, thereby assists in increasing the breakdown voltage. One embodiment may include forming the doping concentration of region 26 between approximately 1E16 and 1E18 atoms/cm$^3$. An embodiment may include that the doping concentration of region 36 may be approximately 1E16 to approximately 1E18 atoms/cm$^3$. Region 36 may typically have a doping concentration of approximately 2E16 atoms/cm$^3$.

Thereafter, body region 31 may be formed in region 42 and separated a distance from region 26. An embodiment may include forming region 31 extending from the surface of region 42 a depth sufficient to contact region 36. Region 31 may have a conductivity type that is the same as region 36 and the opposite of region 26. In an embodiment, a mask may be applied to expose a portion of region 42 where region 31 is to be formed and dopants may be implanted and annealed to form region 31. An embodiment may include forming the doping concentration of region 31 to provide a low resistance connection to region 31 and/or to assist in forming a low ON-resistance for device 10.

Figure 5:
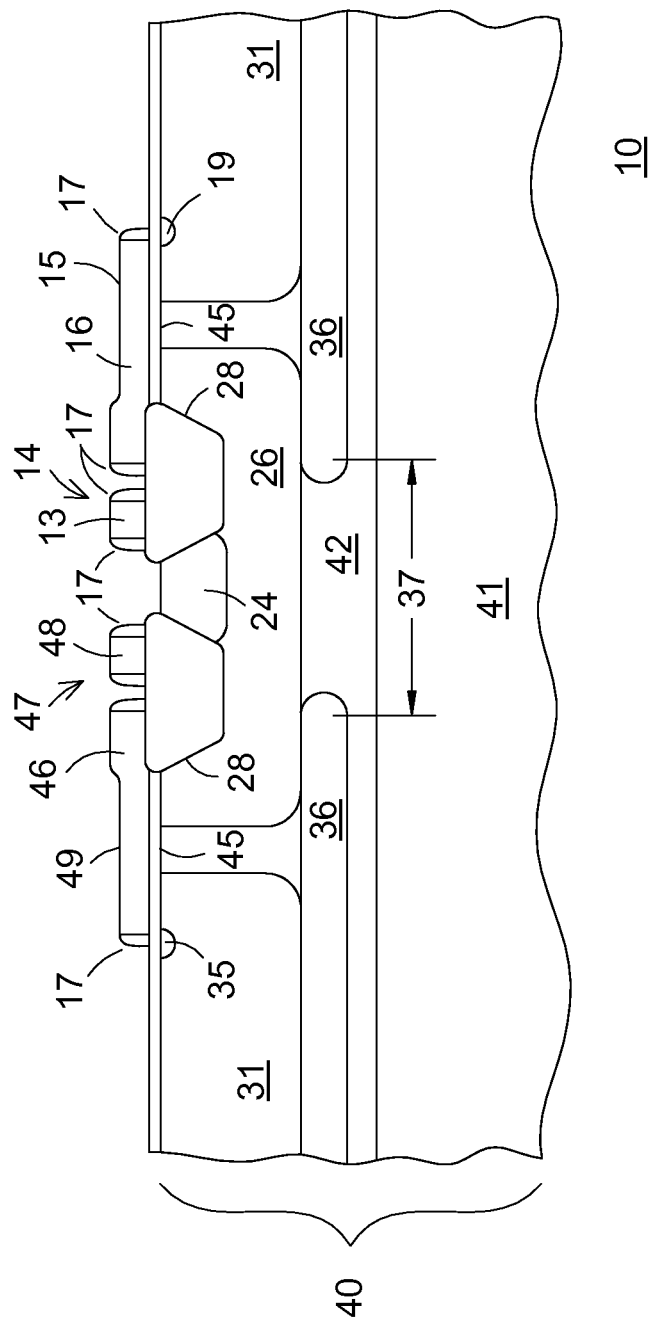

FIG. 5 illustrates another subsequent stage in an example of an embodiment of a method to forming device 10. Vertical drain region 24 may be formed in region 26 extending from the surface a distance into region 26. In one embodiment, region 24 extends a distance that is no greater than distance 63. Subsequently, gate structures 15 and 49 may be formed. A gate insulator 45 may be formed on the surface of region 42 where gate structures 15 and 49 are to be formed. An embodiment may include forming insulator 45 extending to overlie at least a portion of regions 26 and 31. A conductor material may be applied and patterned to form gate conductors 16 and 46 and field plate conductors 13 and 48.

Optional lateral drain regions 19 and 35 may be formed in region 31 so that a portion of regions 19 and 35 underlie at least an outside edge respective conductors 16 and 46 and extend laterally away from the outside edges. Thereafter, spacers 17 may be formed on the outside edges of conductors 16, 13, 48, and 46 such as for example to insulate side portions of the conductors. An embodiment of gate structures 15 and 49 includes insulators 17 along with respective gate conductors 16 and 46. An embodiment of field plate structures 14 and 47 includes insulators 17 along with respective field plate conductors 13 and 48. Gate conductors 16 and 46 and field plate conductors 13 and 48 may be formed from a variety of conductor materials including doped polysilicon, silicides, or metals.

Referring again to FIG. 2, at a subsequent stage in the example of the embodiment of the method of forming device 10, sources 18 and 34 may be formed as doped regions within region 31 and extending into region 31 from a surface of region 42, and drain region 23 may be formed as a doped region within region 24 extending from the surface of region 42 into region 24. An embodiment may include forming the doped regions of sources 18, 23, and 34 at the same time and having a conductivity type that is the same as region 26. The doping concentration of sources 18 and 34 and region 24 may be approximately equal. In an embodiment, the doping concentration of region 24 is less than the doping concentration of region 23 and greater than the doping concentration of region 26. In an embodiment, the doping concentration of region 24 is between approximately 1E17 and approximately 1E19 atoms/cm$^3$. In an embodiment, the doping concentration of region 23 may be no less than approximately 1E18 atoms/cm$^3$. An embodiment may include forming the doping concentration of region 23 to typically be approximately 1E19 to 1E21 atoms/cm$^3$. Thereafter, body contact region 32 may be formed as a doped region within region 31 and extending from the surface of region 42 into region 31. Body contact region 32 typically has the same conductivity type as region 31 and a higher doping concentration in order to form a low resistance electrical connection to region 31.

Subsequently electrodes 54, 55, and 56 may be formed to provide electrical connections to portions of device 10. Electrode 54 may be formed by patterning a conductor material to electrically connect source 18 and 34 together and to body contacts 32. Electrode 55 may be formed by patterning conductor material to electrically connect gate structures 15 and 49 together. Electrode 56 may be formed by patterning conductor material to electrically connect field structures 14 and 47 together and to drain region 23.

One advantage of vertical drain region 24 is to assist in providing an improved ESD performance for device 10. Vertical drain region 24 is formed with a doping concentration that assists in providing a low resistance electrical path to carry the ESD current away from drain 23. An embodiment may include that because of the doping concentration of region 24, the depletion of region 24 is minimized thereby reducing the resistance in region 24. Forming region 24 to have a doping concentration that is less than region 23 and greater than region 26 reduces the resistance to current flow in the region near drain 23. During an ESD event, the reduced resistance reduces the amount of heat generated as the ESD current flows through region 24. Because of the lower resistance, less heat is generated near region 23 and the heat is pushed further vertically onto region 26. Thus, the effect of the heat on the drain electrode is minimized. Forming region 24 overlying opening 38 may assist in confining the electric fields resulting from the ESD event vertically within device 10. The low resistance electrical path formed by region 24 may assist in carrying the ESD current away from corners 29 of insulator 28 which assists in minimizing the intensity of the electrical fields near the surface of region 42 and near corners 29.

Opening 38 assists in providing an improved breakdown for device 10. If a high voltage is applied to drain region 23, buried region 36 assists in causing most of the high electric fields to be steered from drain region 24 vertically through region 26 toward opening 38. Opening 38 facilitates steering the electric fields deeper into region 26, and in some embodiments into region 42, allowing the electric fields to be absorbed by region 26 and/or region 42. In some embodiments, opening 38 may assist in steering the electric fields into portions of region 42 near or underlying region 36. The absorption of the energy in the electric fields increases the temperature in the regions that absorb the energy. Since these regions are spaced away from region 23 and region 24, the effect of the heat on the drain electrodes is minimized. In some embodiments, the depth of vertical drain region 24 may assist in pushing the electric field lines from the bottom side of insulator 28 and into region 26 which assists in improving the breakdown voltage. Field plate conductors 13 and 48 can assist in pushing the electric field away from drain region 23 towards sources 18 and 34 which can also assist in improving the breakdown voltage. In some embodiments, gate conductors 16 and 46 may overlap insulator 28. This overlap can push the electric fields laterally toward drain region 23 and away from sources 18 and 34 which can also assist in improving the breakdown voltage. For embodiments that include more than one of vertical drain region 24, field plate conductors 13 and 48, and/or overlapping gate conductors 16 and 46, the electrical fields can be balanced to also improve the breakdown performance of device 10.

Opening 38 may also facilitate improving the breakdown voltage of device 10 without changing the doping concentration of the device regions. The value of distance 37 can be changed to change the breakdown voltage of the device. Increasing distance 37 can increase the breakdown voltage without changing doping relationships. Thus, the breakdown voltage can be increase without adding additional device layers or doping operations, etc. This assists in reducing the cost of device 10.

Additionally, an embodiment of device 10 may be formed without a separate doped region underlying buried region 36. For example, a portion of region 42 may underlie region 36, but a separate doping operation to form a separate doped region is not needed. For example, because of opening 38, region 36 does not underlie drain 23, therefore, a separate doped region underlying region 36 is not needed because it is not necessary to deplete portions of region 36 that would underlie drain 23. This reduces the number of operations required to form device 10 thereby also assisting in reducing the costs.

An example embodiment may include forming device 10 as an N-channel transistor including forming substrate 41, region 42, region 31, region 32, and region 36 with a P-type conductivity and forming region 26, regions 23 and 24, and sources 18 and 34 with an N-type of conductivity. Those skilled in the art will appreciate that all that the conductivity types may be reversed to form a P-channel transistor.

Figure 6:
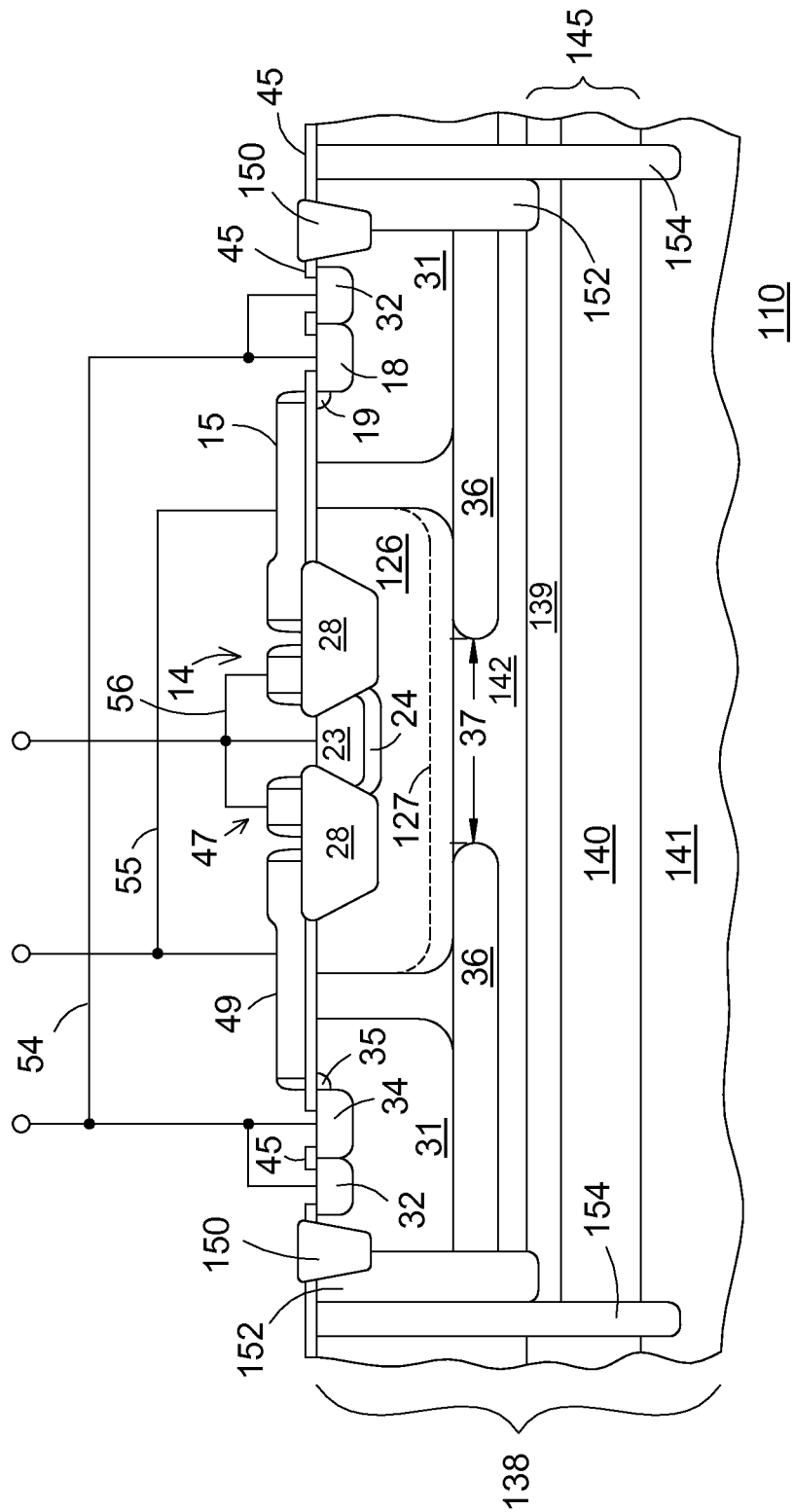
FIG. 6 illustrates an enlarged cross-sectional portion of an example of an embodiment of a semiconductor device that is an alternate embodiment of the device FIG. 1 and FIG. 2 in accordance with the present invention.

FIG. 6 illustrates an example of a portion of an example of an embodiment of a semiconductor device 110 that is an alternate embodiment of device 10. Device 110 is similar to device 10 and includes a semiconductor region 142 that is an alternate embodiment of region 42 of device 10 and a drift region 126 that is an alternate embodiment of region 26. Regions 126 and 142 are similar to regions 26 and 42 except that region 126 has a conductivity type that is the same as region 142. Because region 142 has the same conductivity type as region 126, device 110 includes a vertical isolation region 145, sometime referred to as a pocket, that extends laterally between an underlying bulk semiconductor substrate 141 and region 142. Region 145 isolates regions 126 and 142 from having a direct electrical connection to bulk semiconductor substrate 141. An embodiment of region 145 includes a first isolation layer 140 that is positioned between substrate 141 and region 142 and has a conductivity type that is the opposite of substrate 141 and region 142. Layer 140 forms a P-N junction isolation between layer 140 and substrate 141 which isolates region 142 from substrate 141. Region 145 may also include an optional isolation layer 139 that is positioned between layer 140 and region 142 and that has a conductivity type that is the same as layer 140. An embodiment includes forming layer 139 to have a higher doping concentration than layer 140. The doping concentration of layer 140 typically is no greater than the doping concentration of region 126, and in some embodiments may be less than the doping concentration of region 126. In some embodiments, the doping concentration of layer 139 is no less than the doping concentration of region 126 and in some embodiments may be no less than the doping concentration of region 24. The higher doping concentration of layer 139 forms a depletion layer near the interface of layer 139 and region 142 that assists in inhibiting the formation of parasitic bipolar transistors or other parasitic devices. An embodiment may include forming the doping concentration of layer 140 to be approximately 1E14 to approximately 1E17 atoms/cm$^3$, and forming the doping concentration of layer 139 to be no less than approximately 1E18 atoms/cm$^3$. An embodiment may include forming the doping concentration of layer 140 to typically be approximately 2E15 atoms/cm$^3$ and the doping concentration of layer 139 to typically be approximately 1E19 to 1E20 atoms/cm$^3$.

An embodiment of device 110 may include vertical isolation structures 154 that surround an outer periphery of device 110, for example such as illustrated by dashed lines 70 in FIG. 1. Structures 154 typically extend from the surface of region 142 through layer 140 in order to provide lateral isolation between elements of device 110 and elements of other devices adjacent to device 110. An embodiment may include extending structures 145 to at least touch or in some embodiments extend into substrate 141. Structures 154 may be one of a variety of known isolation structures including a variety of different types of trench isolation structures or a reversed biased diode structure.

Device 110 may also include an optional isolation contact 152 that is used to provide a low resistance electrical connection to layer 139 or in some embodiments to layer 140. Contact 152 typically is formed as a doped region that extends from the surface of region 142 to intersect layer 139 or optionally layer 140. Contact 152 typically has a doping type that is the same as layer 140 and typically has a doping concentration that is similar to the concentration of layer 139. Contact 152 typically is positioned internally to the region surrounded by structure 154. An embodiment of device 110 may so also include an optional field isolation 150 that is positioned between structure 154 and region 31. Isolation 150 may abut or extend into contact 152 and/or into region 31.

Those skilled in the art will appreciate that either or both of structure 154 and isolation 150 may also be formed as a portion of device 10 (FIG. 2).

Those skilled in the art will appreciate that one embodiment of a semiconductor device may comprise:

a semiconductor substrate, for example substrate 41 or 139;

a first semiconductor region, such as for example region 42 or 142, formed as a doped region overlying the semiconductor substrate;

a drift region, such as for example region 26 or 126, formed as a first doped region of a first conductivity type within the first semiconductor region and overlying the semiconductor substrate, the drift region having a first doping concentration;

a first drain region, such as for example region 24 or 124, formed as a second doped region of the first conductivity type within the drift region, the first drain region having a second doping concentration that is greater than the first doping concentration;

a second drain region, such as for example region 23 or 123, of the first conductivity type within the first drain region, the second drain region having a third doping concentration that is greater than the second doping concentration;

a body region, such as for example region 31 or 131, of a second conductivity type in the first semiconductor region and spaced laterally apart from the drift region;

a source region, such as for example region 18/34 or 118/134, of the first conductivity type in the body region; and a buried region, such as for example region 36 or 136, of the second conductivity type underlying the source region, at least a portion of the body region, and at least a portion of the drift region but not underlying the first drain region and the second drain region.

In an embodiment a portion of the first semiconductor region may underlie a portion of the buried region and wherein the portion is not formed as an additional doped region.

In another embodiment, the semiconductor substrate and the first semiconductor region may have the same conductivity type.

An embodiment may include that the first semiconductor region has a conductivity type that is opposite to the drift region.

Another embodiment may include that the third doping concentration is no less than approximately 1E18 atoms/cm$^3$ and the second doping concentration is approximately 1E17 to 1E19 atoms/cm$^3$.

In another embodiment, a field insulator, for example insulator 28, may extend from a surface of the first semiconductor region a first distance into the semiconductor device wherein the first drain region extends no greater than the first distance into the semiconductor device.

Another embodiment may include a field plate conductor, such as conductor 14 for example, on the field insulator and positioned to overlie a portion of the drift region that is adjacent to the first drain region.

An embodiment may include that the buried region has a doping concentration that is substantially no less than the first doping concentration and is substantially similar to a doping concentration of the drift region Another embodiment may include that the semiconductor device is devoid of another doped region that underlies the buried region and that physically and electrically contacts the buried region.

An embodiment may include that the semiconductor substrate, such as substrate 139 for example, has a bulk semiconductor substrate of the first conductivity type, a first layer, such as for example layer 140, of the second conductivity type on the bulk semiconductor substrate, a second layer, such as for example layer 141, of the second conductivity type on the first layer, and the first semiconductor region, such as for example region 142, on second layer.

An embodiment may include an isolation region surrounding the body region and the drift region and extending through the first semiconductor region to at least touch the bulk semiconductor substrate.

In another embodiment, a contact region may extend through the first semiconductor region to electrically connect to the second layer.

Those skilled in the art will understand that an embodiment of a method of forming a semiconductor device may comprise:

forming a semiconductor region, such as for example region 42 or 142, overlying a bulk semiconductor substrate, such as for example bulk substrate 41 or 139;

forming a buried region, such as for example region 36, of a first conductivity type in the semiconductor region;

forming a body region, such as for example region 31, of the first conductivity type in the semiconductor region and overlying a first portion of the buried region;

forming a drift region, such as for example region 26, of a second conductivity type in the semiconductor region and spaced away from the body region including forming at least a portion of the drift region to overlie a second portion of the buried region; and forming a first drain region, such as for example region 23, of the second conductivity type in the drift region wherein the first drain region does not overlie the buried region.

An embodiment may include forming the semiconductor region includes forming a portion of the semiconductor region underlying a portion of the buried region wherein the portion of the semiconductor region is not formed as an additional doped region.

Another embodiment may include providing a semiconductor substrate having a conductivity type of semiconductor region and forming the semiconductor region overlying the semiconductor substrate.

An embodiment may include forming the semiconductor region having a conductivity type that is opposite to the drift region.

Another embodiment of the method may include forming the semiconductor region includes forming a field insulator on a surface of the semiconductor region to extend a first distance into the semiconductor region and wherein the first drain region is formed in an opening of the field insulator and extends no greater than the first distance into the semiconductor region.

In an embodiment, the method may include forming a field plate conductor on the field insulator and electrically connected to the first drain region.

Another embodiment may include forming the first drain region includes forming a second drain region underlying the first drain region wherein the first drain region is formed within the second drain region.

An embodiment may include forming a source region of the first conductivity type in a portion of the body region and overlying the first portion of the buried region and forming a gate conductor overlying a portion of the drift region and a portion of the body region that are between the source region and the first drain region.

An embodiment may include forming a doping concentration of the second drain region to be less than a doping concentration of the first drain region and to be greater than a doping concentration of the drift region.

Another embodiment may include forming a vertical isolation region surrounding an outer periphery of the body region and extending through the semiconductor region a second distance toward a bulk substrate.

Those skilled in the art will appreciate that a method of forming a semiconductor device may comprise:

forming a semiconductor region, such as for example region 42 or 142, overlying a bulk semiconductor substrate, such as for example bulk substrate 41 or 139;

forming a buried region, such as for example region 36, of a first conductivity type in the semiconductor region;

forming a drift region, such as for example region 26, of a second conductivity type in the semiconductor region with at least a portion of the drift region overlying a first portion of the buried region; and forming a first drain region, such as for example region 24, of the second conductivity type in the drift region wherein the first drain region does not overlie the buried region.

Another embodiment may include forming a body region, such as for example region 31, of the first conductivity type in the semiconductor region and overlying a second portion of the buried region and spaced apart from the drift region.

Another embodiment may include forming a second drain region in the first drain region wherein the second drain region does not overlie the buried region.

Another embodiment may include forming the first drain region to extend a distance into the semiconductor region that is no greater than a depth of a field insulator, such as for example insulator 28, that is formed adjacent to the first drain region.

An embodiment may include forming the semiconductor region includes forming a portion of the semiconductor region underlying a portion of the buried region wherein the portion of the semiconductor region is not formed as an additional doped region.

Another embodiment may include providing a semiconductor substrate having a conductivity type of semiconductor region and forming the semiconductor region overlying the semiconductor substrate.

Another embodiment may include forming the semiconductor region having a conductivity type that is opposite to the drift region.

In view of all of the foregoing, it is evident that a novel device and method is disclosed. Included, among other features, is forming a buried region to have an opening underlying a drain region of a transistor. The opening assists in improving the breakdown voltage and assists in reducing processing steps thereby reducing costs. Another feature may include forming a drain region to have a vertical drain region with another drain region formed within the first drain region. This drain structure assists in improving the breakdown voltage of the device. Another feature may include forming the vertical drain region to extend not greater than a field isolation region into the device. This structure also assists in improving the breakdown voltage. Another feature that may be included is forming a field plate conductor to overlie a portion of the field insulator and to be electrically connected to the drain structure. The field plate conductor also assists in improving the breakdown voltage. The herein described features also facilitate forming multiple devices on one substrate wherein some of the devices have different breakdown voltages. For example, devices with different breakdown voltages can be formed using the same doping operations but with different values for the width of the opening in the buried region. This assists in reducing the costs of the devices.

While the subject matter of the descriptions are described with specific preferred embodiments and example embodiments, the foregoing drawings and descriptions thereof depict only typical and examples of embodiments of the subject matter and are not therefore to be considered to be limiting of its scope, it is evident that many alternatives and variations will be apparent to those skilled in the art. The subject matter has been described for a particular MOSFET structure, although the method is directly applicable to other devices including high voltage diodes, bipolar transistors, IGBTs, and other devices.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of an invention. Furthermore, while some embodiments described herein include some but not other features included in other embodiments, combinations of features of different embodiments are meant to be within the scope of the invention, and form different embodiments, as would be understood by those skilled in the art.

The invention claimed is:

1. A semiconductor device comprising:
   a semiconductor substrate;
   a first semiconductor region formed as a doped region overlying the semiconductor substrate;
   a drift region formed as a first doped region of a first conductivity type within the first semiconductor region and overlying the semiconductor substrate, the drift region having a first doping concentration;
   a first drain region formed as a second doped region of the first conductivity type within the drift region, the first drain region having a second doping concentration that is greater than the first doping concentration;
   a second drain region of the first conductivity type within the first drain region, the second drain region having a third doping concentration that is greater than the second doping concentration;
   a body region of a second conductivity type in the first semiconductor region and spaced laterally apart from the drift region;
   a source region of the first conductivity type in the body region; and
   a buried region of the second conductivity type underlying the source region, at least a portion of the body region, and at least a portion of the drift region but not underlying the first drain region and the second drain region.

2. The semiconductor device of claim 1 wherein the third doping concentration is no less than approximately 1E18 atoms/cm$^3$ and the second doping concentration is approximately 1E17 to 1E19 atoms/cm$^3$.

3. The semiconductor device of claim 1 further including a field insulator extending from a surface of the first semiconductor region a first distance into the semiconductor device wherein the first drain region extends no greater than the first distance into the semiconductor device.

4. The semiconductor device of claim 3 further including a field plate conductor on the field insulator and positioned to overlie a portion of the drift region that is adjacent to the first drain region.

5. The semiconductor device of claim 1 wherein the buried region has a doping concentration that is substantially no less than the first doping concentration and is substantially similar to a doping concentration of the drift region.

6. The semiconductor device of claim 1 wherein the semiconductor device is devoid of another doped region that underlies the buried region and that physically and electrically contacts the buried region.

7. The semiconductor device of claim 1 wherein the semiconductor substrate includes a bulk semiconductor substrate of the first conductivity type, a first layer of the second conductivity type on the bulk semiconductor substrate, a second layer of the second conductivity type on the first layer, and the first semiconductor region on second layer.

8. The semiconductor device of claim 7 further including an isolation region surrounding the body region and the drift region and extending through the first semiconductor region to at least touch the bulk semiconductor substrate.

9. The semiconductor device of claim 7 further including a contact region extending through the first semiconductor region to electrically connect to the second layer.

10. The semiconductor device of claim 1 further including an opening in the buried region with the opening underlying the first drain region and the second drain region with a first portion of the buried region extending away from the opening to underlie the source region and a second portion of the buried region extending away from the opening and underlying a portion of the drift region.

11. The semiconductor device of claim 1 wherein a first portion of the buried region extends to underlie one edge of the drift region and another portion of the buried region extends to underlie another edge of the drift region with an opening formed between the first portion of the buried region and the second portion of the buried region, and wherein the opening underlies the first drain region.

12. The semiconductor device of claim 1 wherein a portion of the first semiconductor region is positioned between the body region and the drift region.

13. The semiconductor device of claim 1 further including another source region of the first conductivity type spaced apart from the source region wherein the first drain region is between the source region and the another source region, the another source region overlying a portion of the buried region.

14. The semiconductor device of claim 8 further including a field insulator on a surface of the semiconductor region and extending a first distance into the semiconductor region wherein the first drain region is within an opening in the field insulator.

* * * * *